United States Patent
Mirell et al.

(10) Patent No.: US 7,528,380 B1
(45) Date of Patent: May 5, 2009

(54) METHOD AND APPARATUS FOR GENERATING A FOCUSED BEAM USING DUALITY MODULATION

(76) Inventors: Stuart G. Mirell, 3018 Haddington Dr., Los Angeles, CA (US) 90064; Daniel J. Mirell, 515 Girard Ave., SE. Apt. P, Albuquerque, NM (US) 87106

(*) Notice: Subject to any disclaimer, the term of this patent is extended or adjusted under 35 U.S.C. 154(b) by 180 days.

(21) Appl. No.: 11/744,818

(22) Filed: May 4, 2007

Related U.S. Application Data

(60) Provisional application No. 60/746,469, filed on May 4, 2006.

(51) Int. Cl.
*G21K 1/08* (2006.01)
*H01J 3/14* (2006.01)
*H01J 3/26* (2006.01)
*H01J 49/42* (2006.01)

(52) U.S. Cl. .................................................. 250/396 R
(58) Field of Classification Search ............... 250/396 R
See application file for complete search history.

(56) References Cited

U.S. PATENT DOCUMENTS

| 6,028,686 | A | 2/2000 | Mirell et al. |
| 6,804,470 | B1 | 10/2004 | Mirell et al. |
| 6,954,558 | B2* | 10/2005 | Liu .............................. 385/3 |
| 2007/0019281 | A1 | 1/2007 | Mirell et al. |

* cited by examiner

*Primary Examiner*—Alessandro Amari
(74) *Attorney, Agent, or Firm*—Noel F. Heal

(57) ABSTRACT

An energy-depleted optical or particle beam is generated, transformed into a beam of converging annular cross section, and directed along the same axis as a primary beam. The energy-depleted beam intersects with the primary beam in a tapered annular region in which the two beams destructively interfere, because their wave intensities are adjusted to be equal and their phases are adjusted to be opposite (180 degrees apart). The region of destructive interference effectively compresses and focuses the primary beam to produce a spot size substantially smaller than any spot size attainable using conventional, diffractively limited, optics.

12 Claims, 2 Drawing Sheets

METHOD AND APPARATUS FOR GENERATING A FOCUSED BEAM USING DUALITY MODULATION

CROSS-REFERENCE TO RELATED APPLICATION

This application claims the benefit of U.S. Provisional Application No. 60/746,469, filed 4 May, 2006.

BACKGROUND OF THE INVENTION

This invention relates generally to techniques for generating small-diameter, highly focused optical beams. There are several applications using focused beams where the attainable beam diameter is limited by diffraction. Examples of such applications are: (1) lithography processes as used in the fabrication of semiconductor circuits; (2) microscopy systems in which a specimen must be scanned by the smallest possible beam spot; (3) optical disc media in which recording density is dependent on the spot size of a recording beam; and (4) directed energy beam systems, whether used as weapons or as industrial metal cutting tools, where a highly focused beam is desired.

In these and other similar applications, diffraction effects limit the degree to which a beam can be focused to an extremely small spot size. For example, in high resolution optical lithography as used in the fabrication of semiconductor chips it is well known that a significant limitation is the diameter of an optical beam (or particle beam) impinging on a work surface. More specifically, in a lithography technique known as maskless lithography, often referred to as ML2, various approaches have been proposed but basically they have in common that instead of a lithography mask, one or multiple optical (or particle) beams are focused onto a semiconductor surface to perform a desired fabrication lithography function. Regardless of whether one beam or multiple beams are used, and regardless of whether the beam is an optical beam or a particle beam, resolution is limited by the beam diameter and conventional optical focusing techniques to reduce the beam diameter are ultimately limited by diffraction effects. Using radiation of smaller wavelengths extends the resolution of lithography systems but also has limitations. The present invention provides a novel approach for focusing an optical beam and thereby extending the overall resolution of the system without the need to use smaller wavelengths.

SUMMARY OF THE INVENTION

The present invention resides in a novel method and apparatus for focusing a beam by interaction with an energy-depleted beam. This beam focusing technique will be referred to in this description as depletion-aided focusing (DAF). Generating the energy-depleted beam is a form of duality modulation, a technique whereby beam irradiance is modulated (depleted or enriched) with respect to the beam's wave intensity. More specifically, in the method of the present invention, an energy-depleted beam is controllably converged with a primary beam in such a way that regions of destructive interference have the effect of reducing the diameter of the primary beam and thereby producing a primary beam that is focused to a smaller spot size. In a disclosed embodiment of the invention, an energy-depleted beam of annular cross section is directed along a common axis with the primary beam, to converge on an annular region of the primary beam. The energy-depleted beam is adjusted to have a wave intensity equal to that of the primary beam in the annular region and a phase that is 180 degrees out of phase relative to the primary beam. Destructive interference takes place in a three-dimensional annular region in which the primary and energy-depleted beams converge, leaving a compressed primary beam with a super-focused irradiance spot. In effect, the annular region in which destructive interference takes place may be considered to function as an optical "firewall" that confines energy quanta on the primary beam to a significantly smaller cross-sectional area, thereby providing a more focused beam spot of increased power density.

DETAILED DESCRIPTION OF THE INVENTION

Figure 1:
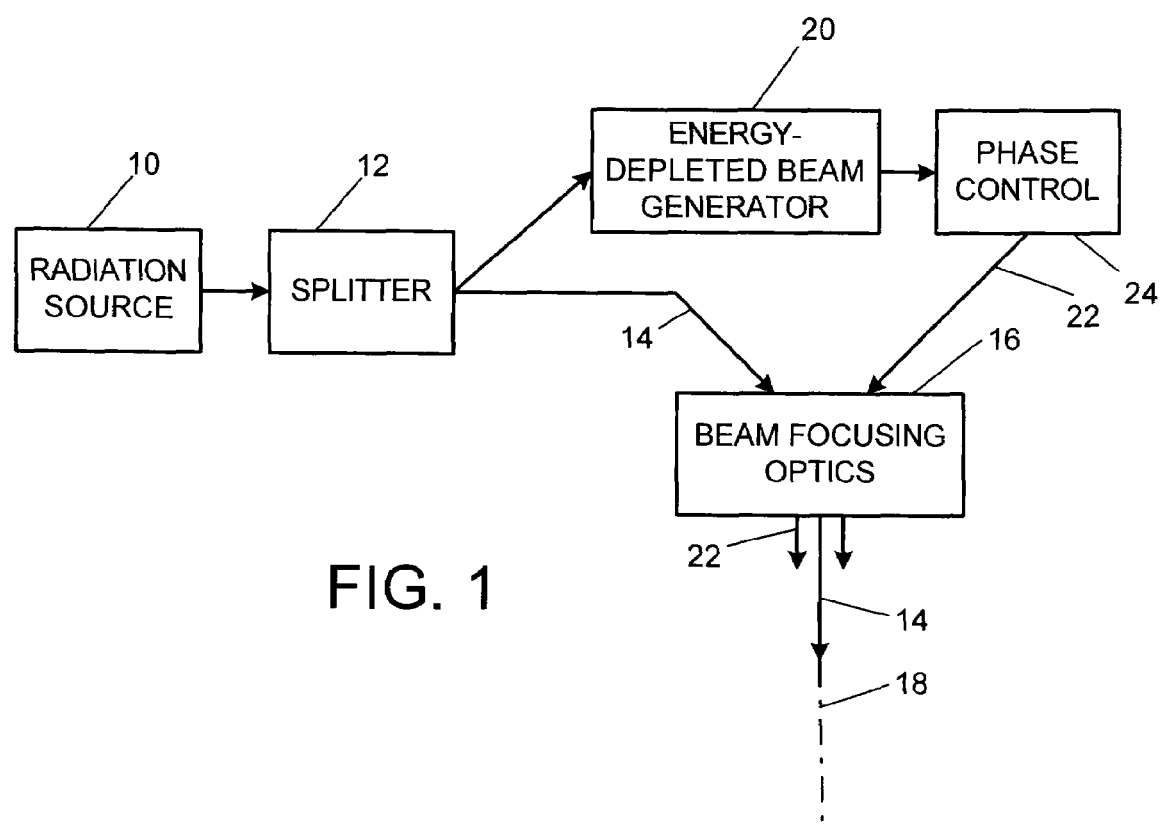
FIG. 1 is block diagram showing the principal components of a system in accordance with the invention.

As shown in the drawings, the present invention is concerned with a technique for producing a reduced-diameter, intensely focused optical (or particle) beam, suitable for use in a lithography system, microscopy system, optical memory system or directed energy source. As shown by way of explanation in FIG. 1, the system includes a radiation source 10, such as a laser or particle beam source, producing a beam that is divided into two portions by a beam splitter 12 that adjusts the relative wave intensities of the two portions. A primary beam 14 from the splitter 12 is processed by beam focusing optics 16 and directed along a principal optical axis 18. A split-off portion of the primary beam 14 is input to an energy-depleted beam generator 20, which produces an energy-depleted beam 22 that is also processed by the beam focusing optics 16.

The energy-depleted beam generator 20 employs the principles described in the present inventors' issued patents, U.S. Pat. No. 6,028,686, entitled "Energy-Depleted Radiation Apparatus and Method," and U.S. Pat. No. 6,804,470, having the same title, and in their pending U.S. patent application Ser. No. 11/188,198, filed Jul. 22, 2005, entitled "Method and Apparatus for Generating and Detection Duality-Modulated Radiation," published as Patent Application Pub. No. US 2007/0019281 A1. The disclosures of these two patents and one patent application publication are hereby incorporated by reference into this specification.

In essence, the energy-depleted beam generator 20 produces an output beam 22 that has a depleted level of irradiance relative to its wave intensity. As indicated by block 24, the energy-depleted beam 22 is controlled in phase such that it is 180 degrees out of phase with the primary beam 14.

Figure 2:
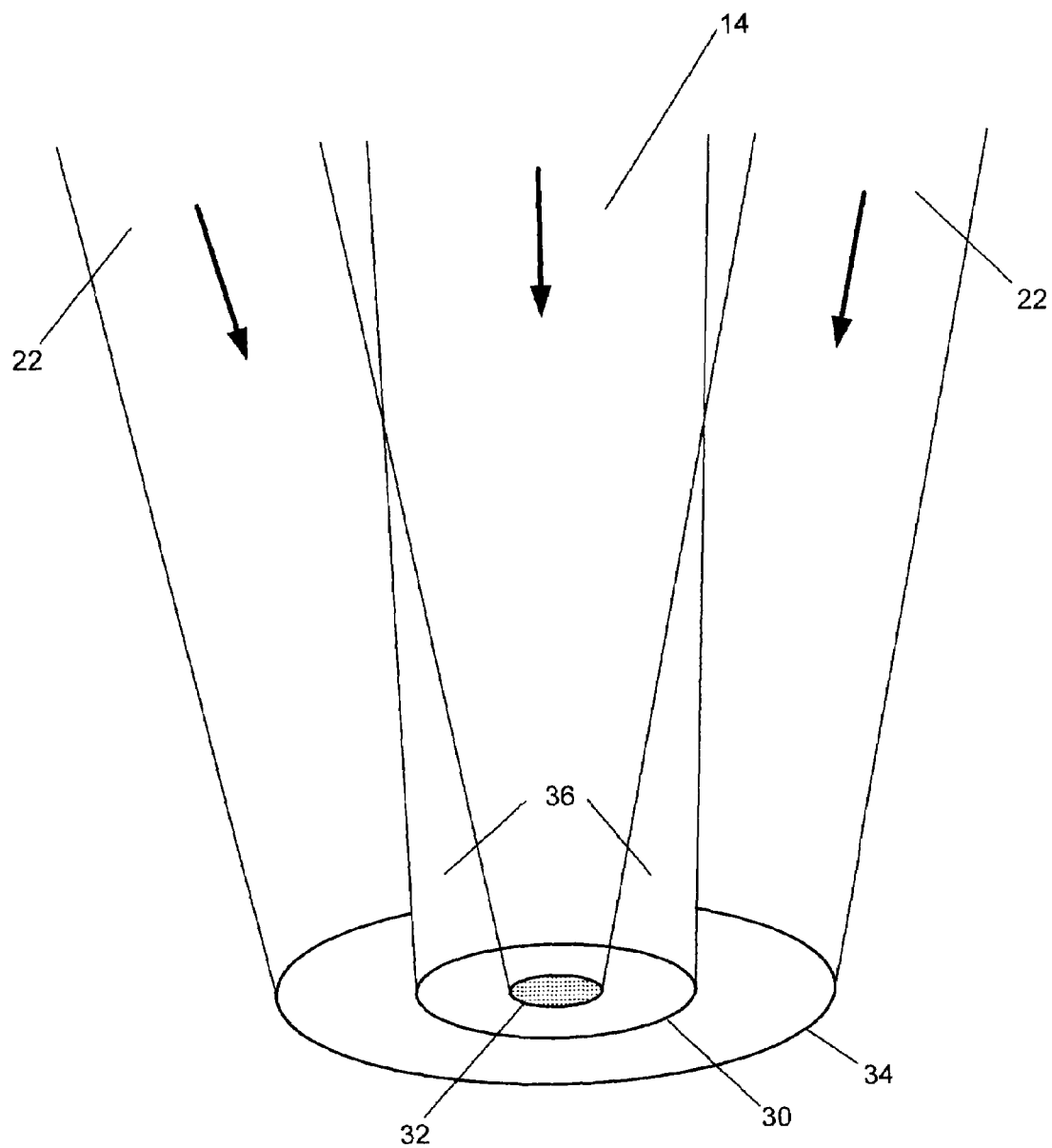
FIG. 2 is an optical ray diagram depicting how a primary beam is intersected with an annular energy-depleted beam.

The beam focusing optics 16 convert the energy-depleted beam 22 to one with an annular cross section, and focus this annular beam along the same optical axis 18 as the primary beam 14. The resulting paths of the primary beam 14 and the annular depleted-energy beam 22 are shown diagrammatically in FIG. 2. The circle 30 indicates the beam spot formed by the primary beam on a target surface perpendicular to the beam axis. The inner and outer circles 32 and 34 indicate the inner and outer limits of the annulus formed on the target plane by the annular energy-depleted beam 22. The tapered annular volume indicated at 36 represents the region in which the primary beam 14 and the energy-depleted beam 22 converge and intersect. Adjustment of splitter 12 and phase control 24 respectively provide equal wave intensity and 180 degree phase difference for the two beams within this region 36. The two beams destructively interfere and the region functions as an optical firewall, with the result that the primary beam 14 is effectively "compressed" and focused to a smaller diameter, represented by the small beam spot within the inner circle 32.

Normally, i.e., if the annular beam were not energy-depleted, a large diameter annular irradiance spot would also be present, effectively defeating the resolution advantage of the super-focused spot. However, essentially no significant irradiance is initially present on the depleted annular beam and the same "firewall" effect that produces the smaller beam spot also prevents an outward transfer of irradiance to the annular beam from the primary beam as the two beams are converged. The net result is the isolation of irradiance at the central super-focused spot by beam interference compression that substantially surpasses the resolution of diffractively limited conventional optical methods.

Duality modulation used in this manner allows an existing lithographic technology operating at some particular wavelength to be economically retrofitted with energy-depleted beam focusing capability, which improves resolution without a costly conversion to a shorter wavelength.

The simple beam configuration described here is most closely associated with maskless lithography (ML2). More elaborate configurations of depleted beam focusing similarly improve other lithographic technologies. It will be appreciated that the invention also applies to particle beam lithography systems, such as electron beam lithography, as well as to optical lithography. More generally, the invention may be used in any application of optical or particle beams in which it is advantageous to produce a beam of very small diameter at a desired target, and in which the attainment of such a small diameter by conventional methods is limited by diffraction effects. Therefore, the invention may be advantageously applied to lithography systems, microscopy systems, optical recording systems and directed energy systems.

It will be appreciated from the foregoing that the present invention represents a significant advance in techniques for generating highly focused optical beams. In particular, the use of invention results in smaller beam diameters than can be obtained by conventional methods that are limited by diffraction effects. It will be understood that, although the invention has been illustrated and described by way of example, various modifications may be made without departing from the spirit and scope of the invention. Accordingly, the invention should not be limited except as by the appended claims.

The invention claimed is:

1. A method for focusing a beam to provide a spot size smaller than that obtained using diffractively limited conventional techniques, the method comprising:
   directing a primary beam along a primary beam axis to impinge on a target at a primary beam spot, the minimum attainable size of which is limited by diffraction effects;
   generating an energy-depleted beam having a depleted level of irradiance relative to its wave intensity;
   converting the energy-depleted beam to a modified energy-depleted beam having an annular cross section;
   focusing and directing the modified energy-depleted beam along the primary beam axis in such a manner as to converge and intersect with the primary beam, to form a tapered annular region in which the volumetric spaces occupied by the primary beam and the modified energy-depleted beam overlap; and
   adjusting the energy-depleted beam in wave intensity and phase to provide in the tapered annular region an energy-depleted beam that is equal in wave intensity to that of the primary beam and 180 degrees out of phase with the primary beam;
   wherein the primary and modified energy-depleted beams destructively interfere in the tapered annular region and the primary beam is effectively focused at the target to a spot size smaller than the primary beam spot size.

2. A method as defined in claim 1, wherein the step of generating an energy-depleted beam comprises:
   generating a first beam in a radiation source;
   splitting the first beam into first and second components; and
   focusing the first component along the primary beam axis as the primary beam;
   generating the energy-depleted beam from the second component.

3. A method as defined in claim 2, wherein the step of adjusting the energy-depleted beam in phase employs a phase control device.

4. A method as defined in claim 2, wherein the step of adjusting the energy-depleted beam in wave intensity comprises controlling the step of splitting the first beam into first and second components.

5. A method as defined in claim 1, wherein the primary and energy-depleted beams are optical beams.

6. A method as defined in claim 1, wherein the primary and energy-depleted beams are particle beams.

7. Apparatus for focusing a beam to provide a spot size smaller than that obtained using diffractively limited conventional techniques, the apparatus comprising:
   means for directing a primary beam along a primary beam axis to impinge on a target at a primary beam spot, the minimum attainable size of which is limited by diffraction effects;
   an energy-depleted beam generator, for generating a beam having a depleted level of irradiance relative to its wave intensity;
   means for converting the energy-depleted beam to a modified energy-depleted beam having an annular cross section;
   means for focusing and directing the modified energy-depleted beam along the primary beam axis in such a manner as to converge and intersect with the primary beam, to form a tapered annular region in which the volumetric spaces occupied by the primary beam and the modified energy-depleted beam overlap; and
   means for adjusting the energy-depleted beam in wave intensity and phase to provide in the tapered annular region an energy-depleted beam that is equal in wave intensity to that of the primary beam and 180 degrees out of phase with the primary beam;
   wherein the primary and modified energy-depleted beams destructively interfere in the tapered annular region and the primary beam is effectively focused at the target to a spot size smaller than the primary beam spot size.

8. Apparatus as defined in claim 7, and further comprising:
   a radiation source, for generating a first beam;
   a splitter, for splitting the first beam into first and second components; and
   means for focusing the first component along the primary beam axis as the primary beam;
   and wherein the energy-depleted beam generator generates the energy-depleted beam from the second component.

9. Apparatus as defined in claim 8, wherein the means for adjusting the energy-depleted beam in phase employs a phase control device.

10. Apparatus as defined in claim 8, wherein the means for adjusting the energy-depleted beam in wave intensity is included in the splitter.

11. Apparatus as defined in claim 7, wherein the primary and energy-depleted beams are optical beams.

12. Apparatus as defined in claim 7, wherein the primary and energy-depleted beams are particle beams.

* * * * *